Figure 1:
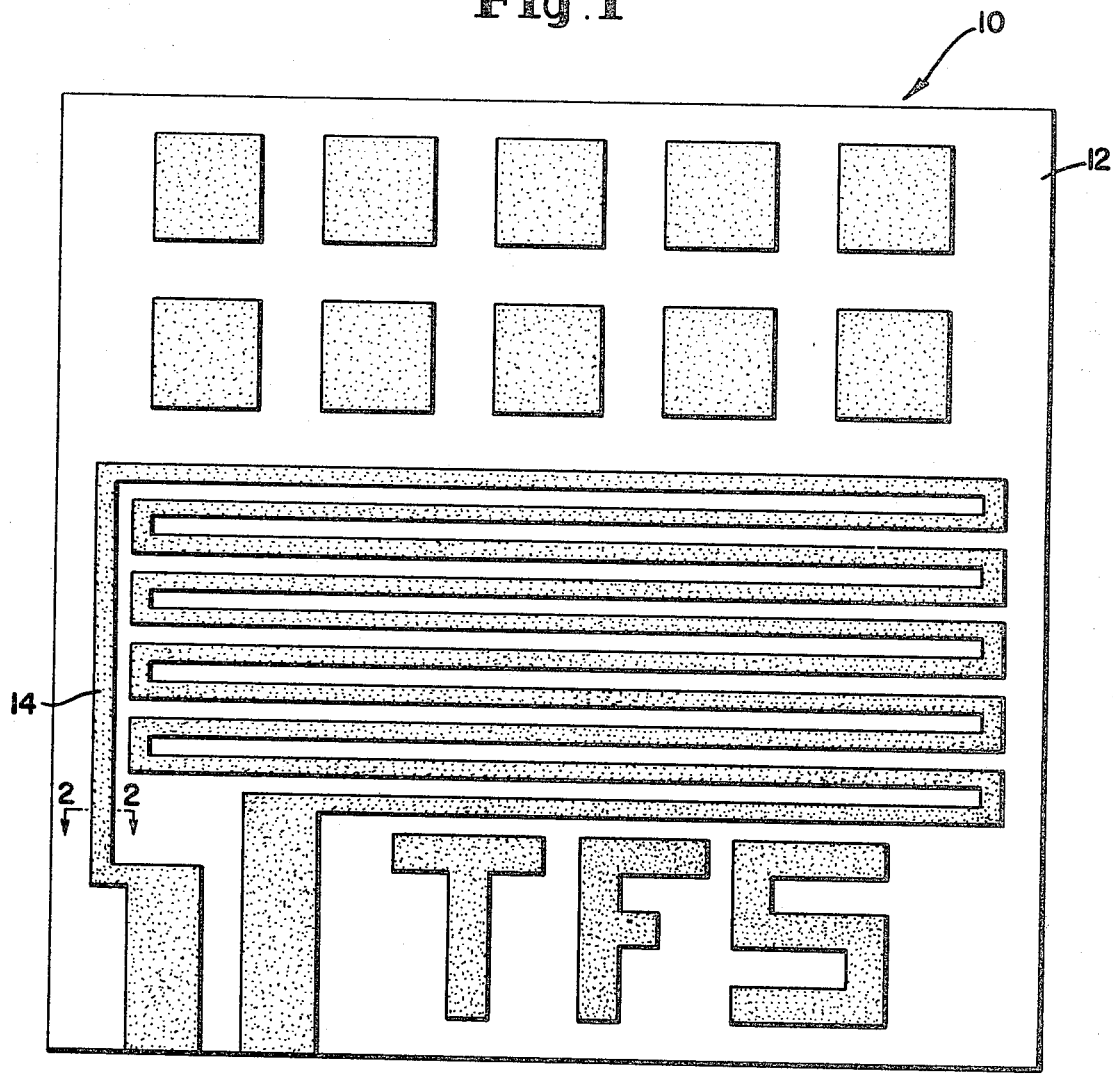

United States Patent [19]

Provance et al.

[11] 4,317,750
[45] Mar. 2, 1982

[54] THICK FILM CONDUCTOR EMPLOYING NICKEL OXIDE

[75] Inventors: Jason D. Provance; Kevin W. Allison, both of Santa Barbara, Calif.

[73] Assignee: Ferro Corporation, Cleveland, Ohio

[21] Appl. No.: 180,446

[22] Filed: Aug. 22, 1980

[51] Int. Cl.³ .............................................. H01B 1/06
[52] U.S. Cl. .................... 252/519; 252/512; 252/513; 427/126.2; 427/96; 427/126.6; 428/210; 428/901; 106/1.05; 106/1.12
[58] Field of Search ...................... 252/512, 513, 519; 428/427, 433, 209, 210, 215, 901, 323, 325, 328, 901; 106/1.05, 1.12; 427/96, 102, 123, 126.3, 126.2, 383 B, 376 A, 376 B, 126.6, 126.1

[56] References Cited

U.S. PATENT DOCUMENTS

| | | | |
|---|---|---|---|
| 3,929,674 | 12/1975 | Patterson | 252/518 |
| 3,943,168 | 3/1976 | Patterson | 252/518 |
| 3,948,812 | 4/1976 | Conen et al. | 252/512 |
| 4,070,517 | 1/1978 | Kazmierowicz | 252/513 |
| 4,079,156 | 3/1978 | Youtsey | 427/96 |
| 4,122,232 | 10/1978 | Kuo | 252/513 |

*Primary Examiner*—Benjamin R. Padgett
*Assistant Examiner*—J. L. Barr
*Attorney, Agent, or Firm*—Quaintance & Murphy

[57] ABSTRACT

A thick film conductor, a process for producing such, and a thick film conductor paste of:
  A. 12 to 25 weight percent boron; and
  B. zero to 35 weight percent glass frit; and
  C. balance essentially nickel oxide;
wherein the combined weight of boron and glass frit is 22 to 45 percent by weight of the paste, all weight percentages being on a dry basis.

17 Claims, 2 Drawing Figures

4,317,750

THICK FILM CONDUCTOR EMPLOYING NICKEL OXIDE

BACKGROUND OF THE INVENTION

This invention relates to thick film conductors employing nickel oxide.

Thick film conductors are well known in the art and are acquiring increasing importance in view of trends in the electronic industry towards smaller and smaller circuits. In the past, thick film conductors have been produced wherein the circuit was of a noble metal. By noble metal is meant gold, silver, palladium, platinum mixtures thereof and alloys thereof. More recently, considerable efforts have been expended in attempting to produce thick film conductors employing base metals such as copper, nickel, and cobalt. Examples of such efforts are described, for example, in:

U.S. Pat. No. 4,070,517 to Kazmierowicz; and
U.S. Pat. No. 4,070,518 to Kazmierowicz; and
U.S. Pat. No. 4,072,771 to Grier; and
U.S. Pat. No. 4,079,156 to Youtsey et al; and
U.S. Pat. No. 4,082,898 to Miller et al; and
U.S. Pat. No. 4,122,232 to Kuo; and
U.S. Pat. No. 4,140,817 to Brown; and
U.S. Pat. No. 4,158,716 to Miller et al; and
U.S. Pat. No. 4,172,919 to Mitchell.

Unfortunately, the prior art suffers from a number of disadvantages. The use of nickel is burdensome because nickel powder tends to oxidize on storage. The oxidation of nickel powder on storage gives the nickel powder an oxide coating which means that the powder is in reality a composition of nickel metal and nickel oxide of varying proportions depending upon the degree of oxidation.

Another severe problem of the prior art is the necessity of employing an inert atmosphere such as that of nitrogen or a reducing atmosphere such as that of hydrogen. Nitrogen atmospheres and the special belt furnaces necessary to employ a nitrogen atmosphere are expensive. Hydrogen atmospheres, in addition to being expensive, are potentially explosive and also require special furnaces for their utilization.

It is therefore an object of the present invention to provide an improved thick film conductor paste substantially free of one or more of the disadvantages of prior pastes.

An additional object of the present invention is to provide a process and a thick film conductor paste that can be fired in air.

Another object of the present invention is to provide an improved thick film conductor paste which does not employ a noble metal.

Yet another object of the present invention is to provide an improved thick film conductor paste which does not require the presence of nickel metal but will tolerate the presence of nickel metal.

Yet another object of the present invention is to provide a thick film conductor paste that has a long shelf life.

Still another object of the present invention is to provide an improved method for making a thick film conductor.

Still another object of the present invention is to provide an improved thick film conductor.

Figure 2:
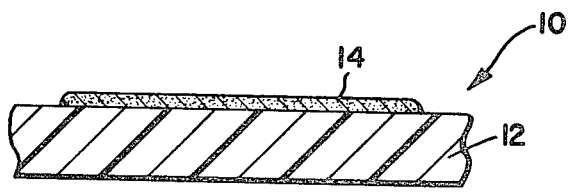

Additional objects and advantages of the present invention will be readily apparent to those skilled in the art by reference to the following detailed description and drawings wherein:

FIG. 1 is a plan view of a thick film conductor 10 of the present invention; and wherein FIG. 2 is an enlarged sectional view taken along Line 2—2 of FIG. 1.

According to the present invention, there is provided a thick film conductor paste of:

a. 12 to 25 and preferably 14 to 20 weight percent boron; and b. zero to 35 and preferably 5 to 25 weight percent glass frit; and c. a balance essentially nickel oxide wherein all weight percentages are on a dry basis;

wherein the combined weight of boron and glass frit is between 22 and 45 weight percent of the paste; wherein all weight percentages are on a dry basis.

According to another aspect of the present invention, there is provided a method for making a thick film conductor comprising the steps of:

I. depositing the thick film conductor paste on an electically non-conductive substrate in the form of a circuit to form a coated substrate; and then II. heating the coated substrate in air at a temperature of 500° to 1100° C. and preferably 750° to 1100° C. for a time sufficient to cause the paste to adhere to the substrate and to render the paste electrically conductive.

Referring now to the drawings, and in particular FIGS. 1 and 2, there is shown a thick film conductor 10. The conductor 10 comprises an electrically non-conductive substrate 12 having a circuit 14 thereon. The circuit 14 is produced on the substrate 12 by applying the paste of the present invention in a pattern in the form of the circuit 14 and then heating the paste as described elsewhere herein.

The boron useful in the present invention is preferably particulate. It generally has a particle size of 0.01 to 100 microns and preferably has a particle size of 0.5 to 15 microns. The boron is preferably pure but can contain up to 10 weight percent of the impurities normally associated with boron. The boron can be in any useful form and can either be amorphous or crystalline. The boron must comprise 12 to 25 weight percent of the thick film conductor paste on a dry basis. It preferably comprises 14 to 20 weight percent of the thick film conductor paste. At percentages which are much less or are much greater, the paste when fired does not have a desirably low resistivity.

In the broadest aspects of the present invention, glass frit need not be present. However, when present, it comprises no more than 35 weight percent of the conductor paste on a dry basis. When present, it preferably comprises from 5 to 25 weight percent on a dry basis. Any glass frit previously employed in thick film conductor pastes can be employed in the present invention; however, lead borosilicate glasses are preferred. Table 1 gives the designation of compositions of five different glass frits suitable for use in the present invention. Glass frit composition B is the preferred composition.

TABLE I

| Oxide | Designation of Composition | | | | |
|---|---|---|---|---|---|
| | A | B | C | D | E |
| $SiO_2$ | 17% | 11% | 7% | 12% | 29% |
| PbO | 69 | 81 | 86 | 9 | 54 |
| $B_2O_3$ | 10 | 4 | 3 | 2.5 | |
| $Al_2O_3$ | 3 | 3 | 3 | | 2 |

TABLE I-continued

| Oxide | Designation of Composition | | | | |
| --- | --- | --- | --- | --- | --- |
|  | A | B | C | D | E |
| ZrO$_2$ | 1 | 1 | 1 |  |  |
| Bi$_2$O$_3$ |  |  |  | 71.5 | 8 |
| CaO |  |  |  | 2 |  |
| WO$_3$ |  |  |  | 1 |  |
| Cu$_2$O |  |  |  | 2 | 3 |
| CdO |  |  |  |  | 4 |
| Total | 100 | 100 | 100 | 100 | 100 |

The nickel oxide useful in the present invention is any binary compound of nickel and oxygen including NiO and Ni$_2$O$_3$ together with any water of hydration and together with the impurities normally associated with them. The preferred nickel oxide is NiO because of reactivity. The nickel oxide is preferably particulate and generally has a particle size of 0.01 to 100 microns and preferably has a particle size of 0.5 to 15 microns. In accordance with the present invention, nickel oxide comprises a major portion of the composition as defined elsewhere herein. On the other hand, admixture of nickel oxide with nickel does not adversely affect the present invention.

Presence of nickel metal in the thick film conductor pastes of the present invention is not required. However, nickel metal does not adversely effect the novel and advantageous properties of the thick film conductor paste of the present invention. When nickel metal is present, it is generally present in a ratio of nickel oxide to nickel metal of 100:1 to 0.1:1 and preferably 10:1 to 0.5:1.

As specified herein, all weight percentages are on a dry basis and do not take into consideration the amount of an inert liquid vehicle which is nevertheless commonly present in the paste. The more volatile components of the inert liquid vehicle normally are removed prior to firing by a simple air-drying process. However, the less volatile components of the inert liquid vehicle are removed during the firing process. As used herein, firing means heating to high temperatures as described elsewhere herein. Any inert liquid vehicle heretofore employed can be employed in the present invention. These inert liquid vehicles commonly comprise a solvent, a thickening agent and any number of optional ingredients. Suitable solvents include among others terpinol, pine oil, glycol, esters, alcohols, ketones, acetone as well as commercially available solvents such as texanol, terpineoil, butyl carbitol, butyl carbitol acetate and the like. Examples of suitable thickening agents include among others ethyl cellulose and nitro cellulose. Examples of optional ingredients include among others perfumes, coloring agents, stabilizers, and other inert ingredients. The inert liquid vehicle is commonly referred to in the art simply as the vehicle. The inert organic vehicle is present in an amount to provide the paste with a viscosity of 500 to 2,000 and preferably 800 to 1,200 poise. Viscosity is normally measured by a Brookfield HBT cone and plate viscometer at 2.50 revolutions per minute with a 1.565 cone. The solids present in the paste are normally dispersed in the inert organic vehicle at a level of generally 50 to 90 and preferably 70 to 80 weight percent solids.

Any substrate heretofore employed to produce a thick film conductor can be employed in the present invention. Preferred compositions of substrates include those of glass, ceramic such as alumina, porcelain coated steel, silicon and glass-bonded mica.

The depositing of the paste on the substrate can be accomplished by any suitable process which produces a pattern in the form of the desired circuit. Dipping, spraying and painting are suitable. However, the preferred method for depositing the paste on the substrate is to pass the paste through a screen having the desired circuit thereon as a pattern. The screen is placed in contact with the substrate and the paste forced through the mesh opening of the screen as is well known in the art. The method is commonly referred to as screen printing.

The temperature of the heating step is absolutely critical to the process of the present invention. If the heating occurs at temperatures of less than 500° C., the resistivity of the paste is not reduced to an appropriate level. Likewise, at temperatures above 1110° C., the resultant air-fired paste will not have a desirably low resistivity. The heating is conducted for a time sufficient to cause the paste to adhere to the substrate and to render the paste electrically conductive. Heating times can vary widely but are generally more than ninety seconds and less than sixty minutes and are preferably 5 minutes to 20 minutes. Heating times less than ninety seconds are generally insufficient to reduce the resistivity. Heating times longer than sixty minutes generally cause an undesirable increase in resistivity. In fact, a special advantage of the present invention is the ability to use the commonly employed belt furnace having a total heating time of 25 minutes with approximately 10 minutes being at the maximum temperature. The heating can also be effected by infrared radiation.

The invention may be better understood by reference to the following examples wherein all parts and percentages are by weight unless otherwise indicated. The examples are summarized in Table II. In Table II, Examples 5, 7, and 9 are not illustrative of the present invention but rather are comparative examples. All other examples are illustrative of the present invention.

EXAMPLE 1

The following quantities and the following ingredients are combined as indicated:

| Item | Ingredient | Parts by Weight |
| --- | --- | --- |
| A | boron | 15 |
| B | glass frit (Composition A) | 20 |
| C | NiO | 65 |

Items A, B and C are mixed in a vessel together with a vehicle which is a mixture of terpinol and ethyl cellulose in the weight ratio of 92:8, in an amount sufficient to give the paste a viscosity of 900 poise.

The paste is screen printed onto an alumina substrate in the form of a circuit 14 shown in FIG. 1. The coated substrate is heated in air for 25 minutes in a belt furnace. Of the 25 minutes total furnace time, 10 minutes were at 600° C. The resistivity of the film is measured with a multimeter and is found to be 1.150 ohms per square.

An identical coated substrate is heated at 850° C. whereupon the resistivity is found to be 0.095 ohms per square.

All resistivity readings given herein have been equilibrated to a circuit one mil (0.001 inches) thick.

The results of Example 1 are recorded in Table II wherein Col. 1 gives the example number. Col. 2 indicates whether the example is inventive in which case an "I" appears in Col. 2 or is comparative, i.e., is not illustrative of the present invention, in which case a "C" appears in Col. 2. Col. 3 gives the weight percent of boron. Col. 4 gives the weight percent of glass frit. Col. 5 gives the combined weight boron and glass frit, i.e. the sum of the entries in Columns 3 and 4. Col. 6 gives the weight percent of NiO. Col. 7 gives the weight percent of $Ni_2O_3$. Col. 8 gives the weight percent of nickel metal. Col. 9 gives the glass composition, the letters appearing in Col. 9 corresponding to the designated glass compositions given in Table I herein. Cols. 10 and 11 gives the resistivity measured in ohms per square when the coated substrate is heated at 600° or at 850° C. respectively.

EXAMPLES 2–14

The procedure of Example 1 is repeated except that the boron is replaced with the amount as disclosed in Col. 3 of Table II. The glass composition is that disclosed in Col. 9 of Table II and is present in the amount shown in Col. 4 of Table II. The amount of NiO or of $Ni_2O_3$ is that shown in Col. 6 or Col. 7 of Table II. The amount of nickel metal is that shown in Col. 8 of Table II. The resistivity is measured and is recorded in Cols. 10 and 11 of Table II.

DISCUSSION OF EXPERIMENTAL RESULTS

Comparative Examples 5, 7, and 9 shows the undesirably high resistivity of over $10^7$ ohms per square that is obtained when the combined weight of boron and glass frit is only 20% i.e. less than the 22% of the present invention.

wherein the combined weight of boron and glass frit is between 22 and 45 weight percent of the paste; wherein all weight percentages are on a dry basis.

2. The paste of claim 1 wherein the boron is present in an amount equal to 14 to 20 weight percent.

3. The paste of claim 1 wherein the glass is present in an amount equal to 5 to 25 weight percent of the paste.

4. The paste of claim 1 wherein the boron is particulate.

5. The paste of claim 1 wherein the boron has a particle size of 0.01 to 100 microns.

6. The paste of claim 1 wherein the nickel oxide is particulate.

7. The paste of claim 1 wherein the nickel oxide has a particle size of 0.01 to 100 microns.

8. The paste of claim 1 further comprising an inert liquid vehicle present in an amount sufficient to give the paste a viscosity of 500 to 2000 poise.

9. A thick film conductor paste having a long shelf life and being adapted for application to a non-conductive substrate which, when fired in air, will form a conductor on a non-conductive substrate; said paste consisting essentially of:
  A. 14 to 20 weight percent particulate boron having a particle size of 0.5 to 15 microns; and
  B. 5 to 25 weight percent glass frit which is a lead borosilicate glass; and
  C. balance essentially nickel oxide;
  wherein the combined weight of boron and glass frit is between 22 and 45 weight percent;
  wherein all weight percentages are on a dry basis;
  wherein the dry ingredients of the paste are dispersed in an inert liquid vehicle present in an amount sufficient to give the paste a viscosity of 800 to 1200 poise;

TABLE II

| 1. Ex. No. | 2. I on C | 3. Boron (wt %) | 4. Glass Frit (wt %) | 5. Comb. (wt %) | 6. NiO (wt %) | 7. $Ni_2O_3$ (wt %) | 8. Ni (wt %) | 9. Glass | 10. when heated @ 600° C. (ohms/sq) | 11. when heated at 850° C. (ohms/sq) |
|---|---|---|---|---|---|---|---|---|---|---|
| 1  | I | 15 | 20 | 35 | 65 | 0  | 0  | A | 1.150 | 0.095 |
| 2  | I | 15 | 20 | 35 | 65 | 0  | 0  | B | 0.140 | 0.113 |
| 3  | I | 15 | 20 | 35 | 65 | 0  | 0  | C | 0.700 | 0.105 |
| 4  | I | 20 | 15 | 35 | 65 | 0  | 0  | B | OS    | 0.150 |
| 5  | C | 10 | 10 | 20 | 80 | 0  | 0  | B | OS    | OS    |
| 6  | I | 15 | 15 | 30 | 70 | 0  | 0  | B | OS    | 0.230 |
| 7  | C | 15 | 5  | 20 | 80 | 0  | 0  | B | OS    | OS    |
| 8  | I | 15 | 25 | 40 | 60 | 0  | 0  | B | 0.160 | 0.071 |
| 9  | C | 15 | 0  | 15 | 85 | 0  | 0  | B | OS    | OS    |
| 10 | I | 25 | 20 | 45 | 55 | 0  | 0  | B | OS    | 5     |
| 11 | I | 15 | 15 | 30 | 0  | 70 | 0  | B | NM    | 0.700 |
| 12 | I | 15 | 15 | 30 | 55 | 0  | 15 | B | 0.670 | 0.365 |
| 13 | I | 15 | 15 | 30 | 45 | 0  | 25 | B | 7.500 | 0.090 |
| 14 | I | 15 | 15 | 30 | 35 | 0  | 35 | B | 2.200 | 0.065 |

Note:
"OS" means off scale on the high side, i.e., a resistivity greater than $10^7$ ohms/square.
"NM" means "not measured".

Although the invention has been described in considerable detail in reference to certain preferred embodiments thereof, it will be understood that modifications and variations can be made within the spirit and scope of the invention as described above and as defined in the appended claims.

What is claimed is:

1. A thick film conductor paste of:
  A. 12 to 25 weight percent boron; and
  B. zero to 35 weight percent glass frit; and
  C. balance essentially nickel oxide wherein the paste has a solids content of 70 to 80 weight percent.

10. A method of making a thick film conductor comprising the steps of:
  I. depositing a thick film conductor paste of:
    A. 12 to 25 weight percent boron; and
    B. zero to 35 weight percent glass frit; and
    C. balance essentially nickel oxide;
  wherein the combined weight of boron and glass is 22 to 45 weight percent of the paste;
  wherein all weight percentages are on a dry basis;

wherein the depositing occurs on an electrically non-conductive substrate in the form of a circuit to form a coated substrate; and then II. heating the coated substrate in air at a temperature of 500° to 1100° C. for a time sufficient to cause the paste to adhere to the substrate and to render the paste electrically conductive.

11. The method of claim 10 wherein the substrate is a material selected from the group consisting of glass, ceramic, alumina, porcelain-coated steel, silicon and glass-bonded mica.

12. The method of claim 10 wherein the air is atmospheric air containing approximately 20.9 weight percent oxygen.

13. The method of claim 10 wherein the heating is conducted at a temperature of 750° to 1100° C.

14. The method of claim 10 wherein the heating time is ninety seconds to sixty minutes.

15. A method of making a thick film conductor comprising the steps of:

I. depositing a thick film conductor paste of:
  A. 14 to 20 weight percent particulate boron; and
  B. 5 to 25 weight percent glass frit; and
  C. balance essentially particulate nickel oxide;
wherein the combined weight of boron and glass frit is between 22 and 45 weight percent of the paste;
wherein all weight percentages are on a dry basis;
wherein the particulate boron and the particulate nickel oxide have a particle size of from 0.5 to 15 microns;
wherein the solid content of the paste is dispersed in an inert liquid vehicle present in an amount sufficient to give the paste a viscosity of 800 to 1200 poise;
wherein the solid content of the paste is 70 to 80 weight percent;
wherein the paste is deposited on an electrically non-conductive substrate in the form of a circuit to form a coated substrate; and then II. heating the coated substrate in atmospheric air at atmospheric pressure at a temperature of 750° to 1100° C. for 5 to 20 minutes to cause the inert liquid vehicle to evaporate, to cause the paste to adhere to the substrate and to give the paste electrical resistivity of less than 10 ohms per square.

16. A thick film conductor comprising:
I. an electrically non-conductive substrate; and
II. an electrically conductive circuit on the substrate which circuit is the heated-in-air product of a thick film conductor paste of:
  A. 12 to 25 weight percent boron; and
  B. zero to 35 weight percent glass frit; and
  C. balance essentially nickel oxide;
wherein the combined weight of the boron and the glass frit is 22 to 45 weight percent of the paste;
wherein all weight percentages are on a dry basis;

17. The conductor of claim 16 wherein the residue of the thick film conductor paste has a resistivity of less than 10 ohms per square.

* * * * *